(12) United States Patent
Echols et al.

(10) Patent No.: US 7,682,879 B2
(45) Date of Patent: Mar. 23, 2010

(54) EDGE COATING A MICROELECTRONIC DEVICE

(75) Inventors: Robert Michael Echols, Jordan, MN (US); Michael Richard Fabry, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/460,503

(22) Filed: Jul. 27, 2006

(65) Prior Publication Data

US 2007/0228532 A1   Oct. 4, 2007

Related U.S. Application Data

(60) Provisional application No. 60/786,473, filed on Mar. 28, 2006.

(51) Int. Cl.
*H01L 21/00* (2006.01)

(52) U.S. Cl. .................. 438/127; 257/787; 257/788; 257/789; 257/790; 257/795; 257/E31.117; 257/E23.116; 257/E23.129; 257/E21.503; 257/678; 257/E33.059; 257/687; 257/688; 257/689; 257/701; 257/737; 257/782; 257/123; 257/157

(58) Field of Classification Search .......... 257/678, 257/687, 688, 689, 701, 737, 782, 788, 790, 257/123, 157

See application file for complete search history.

(56) References Cited

U.S. PATENT DOCUMENTS

| | | | | |
|---|---|---|---|---|
| 5,818,105 A * | 10/1998 | Kouda | ................ | 257/696 |
| 6,049,124 A * | 4/2000 | Raiser et al. | ............ | 257/712 |
| 6,104,093 A * | 8/2000 | Caletka et al. | ............ | 257/778 |
| 6,229,204 B1 * | 5/2001 | Hembree | ............ | 257/675 |
| 6,492,204 B1 | 12/2002 | Jacobs | | |
| 6,846,559 B2 * | 1/2005 | Czaplicki et al. | ....... | 428/355 EP |
| 6,955,948 B2 * | 10/2005 | Asahi et al. | ............ | 438/125 |
| 6,975,035 B2 | 12/2005 | Lee | | |
| 6,987,058 B2 | 1/2006 | Hall | | |
| 7,022,410 B2 | 4/2006 | Tonapi et al. | | |
| 2002/0060368 A1 | 5/2002 | Jiang | | |
| 2003/0205722 A1 * | 11/2003 | Washio et al. | ............ | 257/197 |
| 2004/0164390 A1 * | 8/2004 | Wang | ............ | 257/686 |
| 2004/0234741 A1 * | 11/2004 | Hosomi et al. | ............ | 428/292.1 |

* cited by examiner

*Primary Examiner*—Minh-Loan T Tran
*Assistant Examiner*—Fei Fei Yeung Lopez
(74) *Attorney, Agent, or Firm*—Leanne Taveggia Farrell; Westman, Champlin & Kelly, P.A.

(57) ABSTRACT

A microelectronic device includes a die having an active surface and a non-active surface. To assemble the microelectronic device, the active surface of the die is placed on a substrate. A first material is dispensed between the active surface of the die and the substrate. A second material is dispensed on at least a portion of the non-active surface of the die. The second material is different than the first material and the first material and the second material are simultaneously cured.

18 Claims, 4 Drawing Sheets

EDGE COATING A MICROELECTRONIC DEVICE

CROSS-REFERENCE TO RELATED APPLICATION

This application claims the benefit of U.S. Provisional Application 60/786,473 filed on Mar. 28, 2006 for inventors Robert Michael Echols and Michael Richard Fabry and entitled COMBINED UNDERFILL AND DIE EDGE COATING PROCESS FOR FLIP CHIP ASSEMBLIES.

FIELD OF THE INVENTION

The present invention relates generally to microelectronic devices, and more particularly, but not by limitation, to preventing particulation of microelectronic devices.

BACKGROUND OF THE INVENTION

"Flip chip" is a common process with which microelectronic devices, such as semiconductor devices, are electrically and mechanically coupled to a substrate, such as a circuit board or other type of circuit carrier. In general the "flip chip" process allows a die or chip to be directly coupled to the substrate by being placed faced down (i.e. "flipped") on the substrate instead of the die being placed "face-up". This older "face-up" technology is commonly called "wire bonding" and uses wires to connect to each contact pad of the substrate. "Flip chip" provides an alternative to "wire bonding" that includes advantages in its small size, performance, flexibility, reliability and cost. "Flip chip" is often used in smaller electronic devices such as cell phones, digital music players, personal data assistants and data storage systems.

There are generally three stages to assembling a "flip chip". First, the die is bumped with a conductive material. Next, the bumped die is attached to the substrate. Lastly, the remaining spaces under the die are filled with a non-conductive material that strengthens the otherwise fragile connection provided by the bumped conductive material, protects the bumps and compensates for any thermal expansion difference between the die and the substrate. Examples of different kinds of bumping include solder bumping, plated bumping, gold stud bumping and conductive adhesive bumping.

One significant disadvantage of the "flip chip" is the delicate surface of the die that is exposed after it is "nipped" and underfilled. The exposed side of the die is vulnerable to mechanical damage, especially semiconductor dies which are susceptible to damage caused by the brittle nature of the elemental silicon that the semiconductor die is made of. Small particles of elemental silicon can emanate from mechanical damage sites that are commonly found on the edges of the exposed surface. In addition, small particles of elemental silicon can emanate from various places on the semiconductor die depending on manufacturing conditions. Regardless of how these small particles emanate from the semiconductor die, these particles can damage the electronic devices that the "flip chip" is positioned in.

In order to eliminate the particulation of mechanical damage sites on a die and particulation due to manufacturing of the die, often, a die can be totally encapsulated or coated with a backside film coating. Although an encapsulated die or backside film coated die is protected or somewhat protected from inadvertent contact damage, an encapsulated die or backside film coated die have process and cost limitations. Complete encapsulation of the die requires a secondary process, which results in a significant cost increase to the finished assembly. In addition, certain small-sized electronic devices that include design space limitations cannot tolerate the material that flows away from the die that occurs during full encapsulation. Backside film coating of the die does provide a degree of protection from near-perpendicular impacts to the backside of the "flip chip", however, backside film coating does not protect the edges or corners of the die. Thus, backside film coating does not protect against the most common source of particulation from the die.

Embodiments of the present invention provide solutions to these and other problems, and offer other advantages over the prior art.

SUMMARY OF THE INVENTION

A method of assembling a microelectronic device is provided. The assembled microelectronic device eliminates particulation from its side edges due to mechanical damage sites as well as due to manufacturing quality, such that an electronic device, in which the microelectronic device is located in, will not fail. The microelectronic device includes a die having an active surface and a non-active surface. The active surface of the die is placed on a substrate. A first material is dispensed between the active surface of the die and the substrate. A second material is dispensed on at least a portion of the non-active surface of the die. The second material is different than the first material and the first material and the second material are simultaneously cured.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
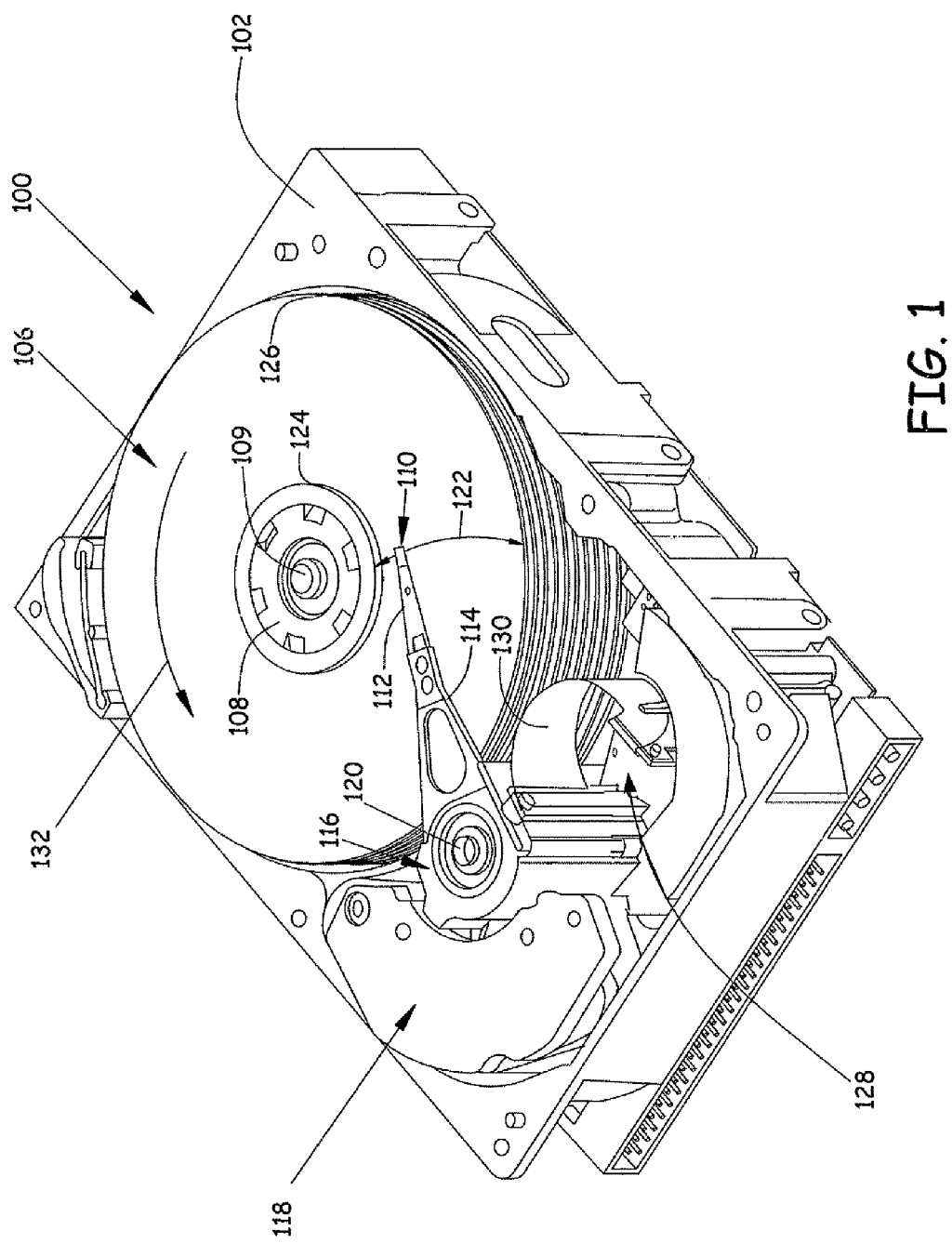
FIG. 1 illustrates perspective view of a disc drive.

FIG. 1 is a perspective view of a data storage system or disc drive 100. Disc drive 100 includes a housing having a base 102 and a top cover (not shown). Disc drive 100 further includes a disc pack 106, which is mounted on a spindle motor (not shown) by a disc clamp 108. Disc pack 106 includes a plurality of individual discs 107, which are mounted for co-rotation about central axis 109. Although not illustrated in FIG. 1, disc drive 100 can also include a single disc that is mounted to a spindle motor by disc clamp 108. Regardless of the quantity of discs, each disc surface has an associated disc head slider 110, which is mounted to disc drive 100 for communication with the disc surface. In FIG. 1, sliders 110 are supported by suspensions 112, which are in turn attached to track accessing arms 114 of an actuator mechanism 116. The actuator mechanism shown in FIG. 1 is of the type known as a rotary moving coil actuator and includes a voice coil motor (VCM), shown generally at 118. Voice coil motor 118 rotates actuator mechanism about pivot shaft 120 to position sliders 110 over a desired data track along an arcuate path 122 between a disc inner diameter 124 and a disc outer diameter 126.

Disc drive 100 further includes a preamplifier for generating a write signal applied to sliders 120 during a write operation, and for amplifying a read signal emanating from slider 120 during a read operation. A read/write channel receives data from the processing circuitry during a write operation, and provides encoded write data to the preamplifier. During a read operation, the read/write channel processes a read signal generated by the preamplifier in order to detect and decode data recorded on medium 112.

A flexible circuit assembly 128 provides the requisite electrical connection to and from read/write elements on the disc head slider and the arm electronics on the actuator mechanism 116. Flexible circuit assembly 128 includes a flexible cable 130, which provides electrical traces or electrical leads while allowing pivotal movement of actuator mechanism 116 during operation. Flexible cable 130 provides an electrical path from the read/write elements and actuator mechanism 116 to a connector for connection to a printed circuit board (PCB) and ultimately to a host computer. Flexible circuit assembly 128 is described in further detail with reference to FIG. 2.

Figure 2:
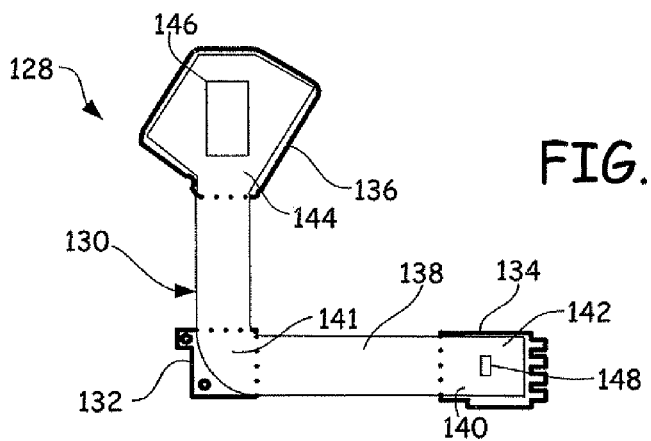
FIG. 2 illustrates a plan view of the flexible circuit assembly illustrated in FIG. 1.

FIG. 2 illustrates a plan view of flexible circuit assembly 128 illustrated in FIG. 1. Flexible circuit assembly 128 is illustrated in a state prior to being positioned in disc drive 100. Flexible circuit assembly 128 includes flexible cable 130. Flexible cable 130 is laminated to a set of stiffener plates. The set of stiffener plates include a first stiffener plate 132, a second stiffener plate 134 and a third stiffener plate 136. Flexible cable 130 includes a service loop portion 138 having a first end 140 and a second end 141. Service loop portion 138 is the portion of flexible cable 130 that moves with actuator mechanism 116 (FIG. 1) during the data seeking process in a data storage system. First end 140 of service loop portion 138 coincides with a first end 142 of flexible cable 130 and is laminated to second stiffener plate 134. Second end 141 of service loop portion 138 is laminated to first stiffener plate 132. A second end 144 of flexible cable 130 is laminated to the third stiffener plate 136.

Second end 144 of flexible cable 130 includes an electrical connector 146 as previously discussed in FIG. 1. Electrical connector 146 is configured to electrically couple the electrical traces on flexible cable 130 to a printed circuit board that is coupled to disc drive 100 (FIG. 1) and ultimately to a host device. First end 142 of flexible cable 130 includes a microelectronic device 148. Microelectronic device 148, in the embodiment illustrated in FIG. 2, is a preamplifier. Microelectronic device 148 generates a write signal applied to sliders 120 (FIG. 1) during a write operation and amplifies a read signal emanating from sliders 120 during a read operation. Microelectronic device 148 is attached to first end 142 of flexible cable 130 using a flip chip process. Microelectronic device 148, as illustrated in FIG. 2, is a semiconductor device. It should be recognized, however, that the present invention is not limited to a microelectronic device in a data storage system nor a preamplifier in a data storage system. It should also be understood that the present invention includes other types of microelectronic devices that are placed in various types of electronic devices. Example microelectronic devices include passive filters, detector arrays and MEMs (micro-electro mechanical system) devices. Example electronic devices include personal digital assistants, mobile phones, digital music players and laptops. These various types of electronic devices can include many different types of semiconductor devices that perform various functions in an electronic device and utilize a flip chip process for assembly to a substrate.

Figure 3:
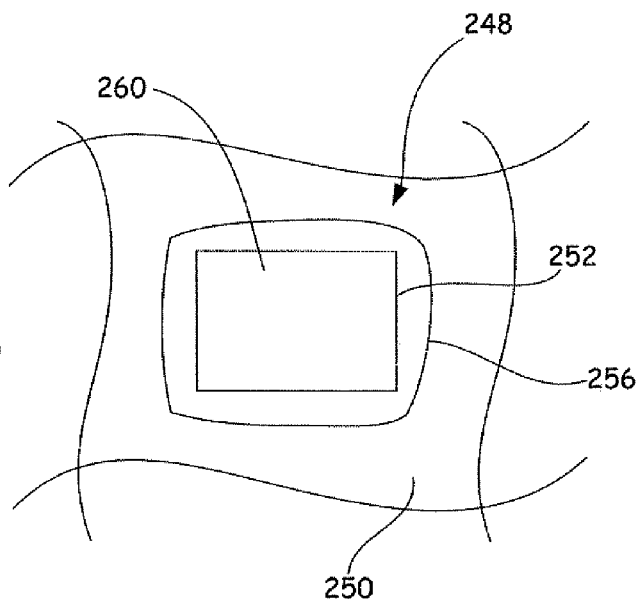
FIG. 3 illustrates a top plan view of a microelectronic device in accordance with the prior art.
Figure 4:
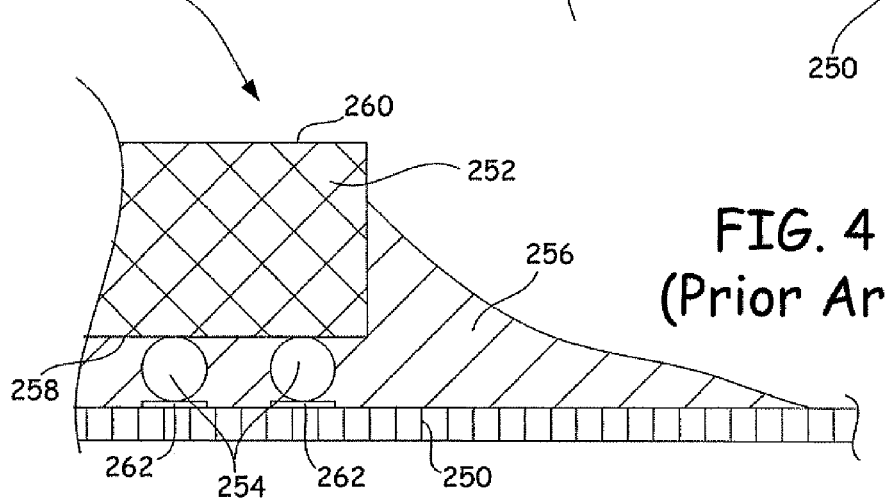
FIG. 4 illustrates a partial sectional view of the microelectronic device of FIG. 3.

FIG. 3 illustrates an enlarged top plan view of a microelectronic device 248 and FIG. 4 illustrates an enlarged sectional view of microelectronic device 248. Both figures illustrate microelectronic device 248 as assembled to a substrate 250 in accordance with a standard flip chip process used in the prior art. Microelectronic device 248 includes a die 252, a plurality of conductive bumps 254 and an underfill 256. Die 252 includes an active surface 258 and a non-active surface 260. Prior to attaching die 252 to substrate 250, the plurality of conductive bumps 254 are placed on active surface 258. Example conductive bumps include solder bumps, plated bumps, gold stud bumps and conductive adhesive bumps. Die 252 is then placed on substrate 250 by aligning the conductive bumps 254 with electrical contact pads 262 on the substrate. Conductive bumps 254 are heated such that the bumps form an electrical and mechanical connection with electrical contact pads 262. Underfill 256 is then deposited between substrate 250 and active surface 258 of die 252 and in between conductive bumps 254. In general, underfill 256 can be an epoxy. Since conductive bumps 254 provide a fragile mechanical connection with the electrical contact pads 262, underfill 256 provides die 252 with a robust coupling to substrate 250.

The exposed sides of die 252 are vulnerable to mechanical damage particularly on the exposed edges and corners of the die. For example, die 252 can be a semiconductor die that is made of very brittle elemental silicon. Small particulates of elemental silicon can emanate from mechanical damage sites on edges of die 252. Such particulates can cause system failure in electronic devices, such as data storage systems, in which die 252 is located in.

Figure 5:
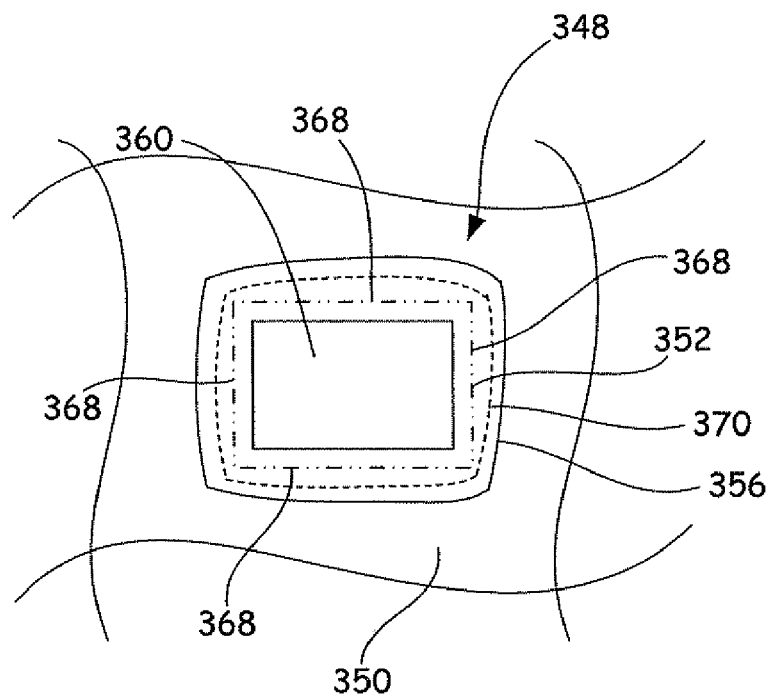
FIG. 5 illustrates a top plan view of a microelectronic device in accordance with the present invention.
Figure 6:
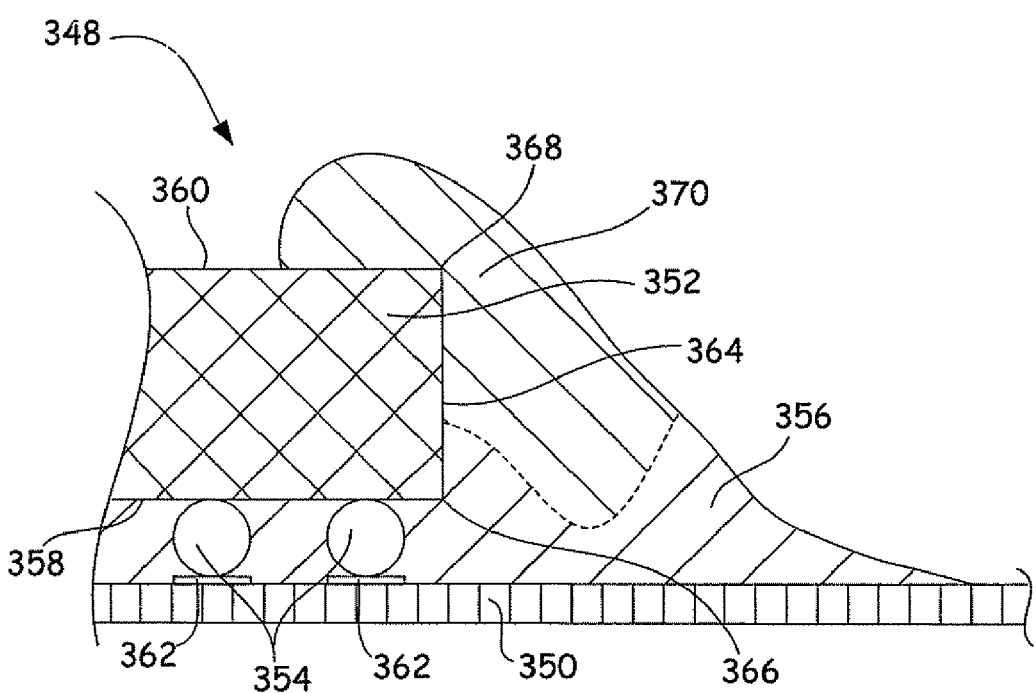
FIG. 6 illustrates a partial sectional view of the microelectronic device of FIG. 5.

FIG. 5 illustrates an enlarged top plan view of a microelectronic device 348 and FIG. 6 illustrates an enlarged sectional view of microelectronic device 348. Both figures illustrate microelectronic device 348 as assembled to a substrate 350 in accordance with the present invention. In one embodiment, microelectronic device 348 is a preamplifier and substrate 350 is a flexible cable as illustrated in FIG. 2. However, as previously discussed, microelectronic device 348 and substrate 350 can be located in various types of electronic devices and can perform various types of functions. FIGS. 5 and 6 will be discussed in conjunction with the method of assembling microelectronic device 348 illustrated as a flowchart 400 in FIG. 7.

Figure 7:
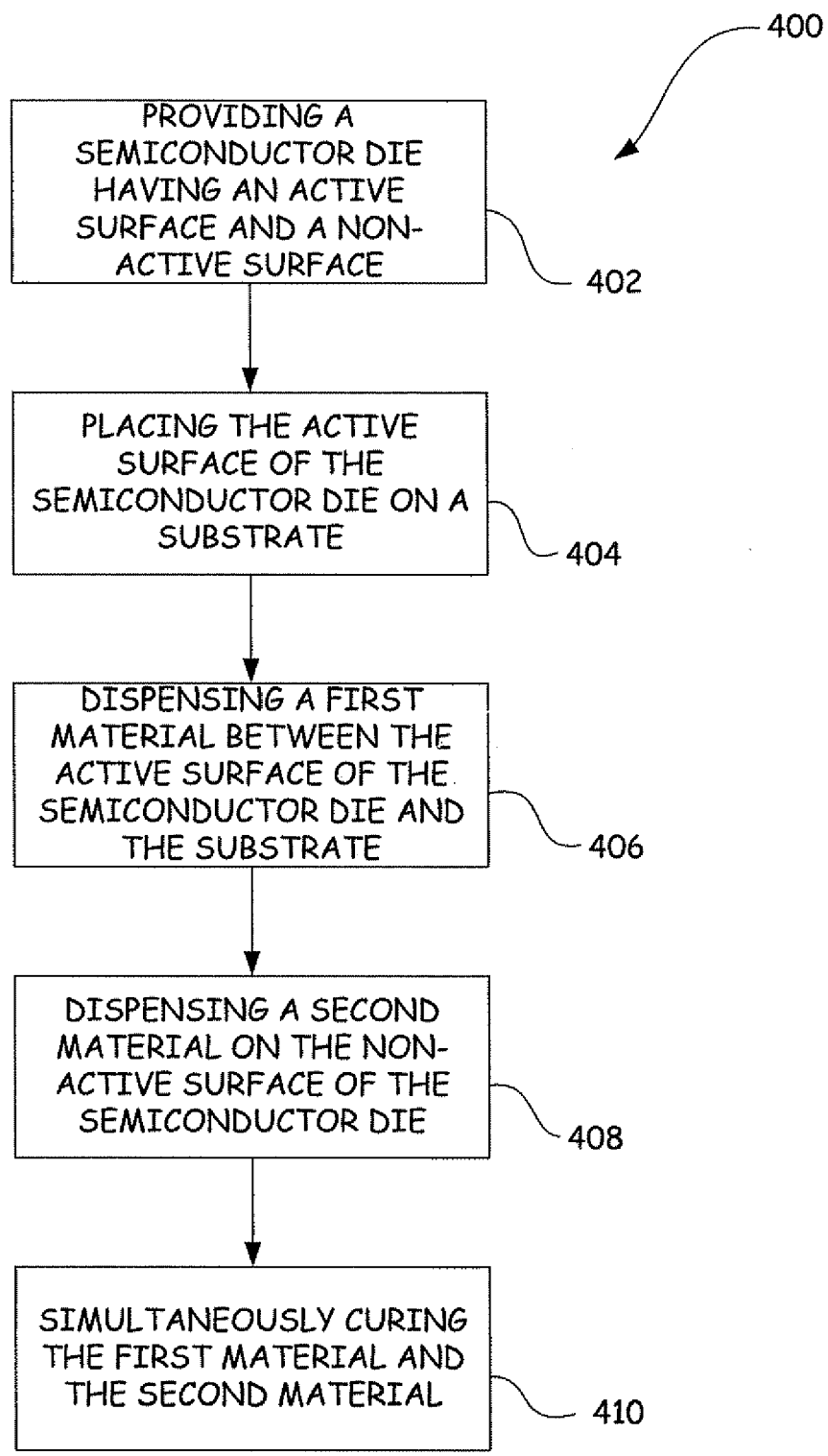
FIG. 7 is a flowchart illustrates the process of assembling the microelectronic device illustrated in FIGS. 5 and 6.

At block 402 in FIG. 7, a die 352 is provided and has an active surface 358 and a non-active surface 360 (see FIG. 6). Die 352 includes a plurality of sidewalls 364 about a perimeter of the die and between the active and non-active surfaces 358 and 360 (see FIG. 6). Sidewalls 364 form active side edges 366 with the active surface 358 and form non-active edges 368 with the non-active surface 360 (see FIGS. 5 and 6). A plurality of conductive bumps 354 are placed on active surface 358 (see FIG. 6). Bumps 354 are configured to aid in connecting die 352 with a plurality of contact pads 362 on substrate 350 (see FIG. 6). At block 404, active surface 358, which includes the plurality of conductive bumps 354, is placed on substrate 350. In one embodiment, the conductive bumps 354 are solder balls that are heated such that they are able to "reflow" and make an electrical and mechanical connection with the plurality of contact pads 362 on substrate 350.

At block 406, a first material 356 is dispensed between active surface 358 of semiconductor die 352 and substrate 350 (see FIG. 6). First material 356 fills the spaces between conductive bumps 354 and along sidewalls 364. First material 356 is an epoxy and provides die 352 with a resilient and robust attachment to substrate 350. At block 408, a second material 370 is dispensed on at least a portion of non-active surface 360 of die 352 (see FIGS. 5 and 6). Specifically, second material 370 coats non-active side edges 368, along sidewalls 364 and is deposited on first material 356. Second material or coating 370 is also an epoxy. However, second material 370 is different than first material 356. As illustrated in FIG. 5, non-active side edges 368 are illustrated in dashed lines because they are hidden from view by second material 370. As illustrated in both FIGS. 5 and 6, the interface of first material 356 and second material 370 are illustrated in dashed lines. The dashed lines illustrate where second material 370 was dispensed onto first material 356.

At block 410, first material 356 and second material 370 are simultaneously cured. A simultaneous cure provides a cost-effective coating to die 352. Coating non-active edges 368 can be an in-line process that does not impact existing production throughput or production cycle rate.

The epoxy of first material 356 contains a somewhat similar epoxy resin system as does the epoxy resin system of second material 370. Having a similar epoxy resin system allows the first material and the second material to be simultaneously cured. Such a cure fuses first material 356 and second material 370 together. The fused cure is illustrated in both FIGS. 5 and 6 by the dashed line interface.

Although first material 356 and second material 370 are able to be simultaneously cured by having similar resin systems, the first material and the second material have different compositions. The composition of first material 356 includes properties of adhesion to provide a resilient bond between die 352 and substrate 350. To provide such properties, first material 356 can include, but is not limited to, a resin system having a silica filler. The composition of second material 370 includes thixotropic properties. Thixotropic properties allow second material 370 to be precisely deposited in a precise pattern on non-active side edges 368 without significant flowout during the curing process. To provide such properties, second material 370 can include, but is not limited to, a resin system having a small particle sized silicon dioxide filler that acts as a thickener for the epoxy. An example synthetic silicon dioxide filler includes CAB-O-SIL® produced by Cabot Corporation of Boston, Mass.

After curing, second material or coating 370 provides a uniform thickness over non-active edges 368 which protects die 352 from subsequent damage due to handling or additional subsequent assembly operations. Second material or coating 370 seals and contains particulation from the non-active side edges 368 of die 352.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the microelectronic device while maintaining substantially the same functionality without departing from the scope and spirit of the present invention. In addition, although the preferred embodiment described herein is directed to a microelectronic device for a data storage system, it will be appreciated by those skilled in the art that the teachings of the present invention can be applied to other types of electronic devices, without departing from the scope and spirit of the present invention.

What is claimed is:

1. A method of assembling a microelectronic device comprising:
   providing a die having an active surface, an opposing non-active surface substantially parallel with the active surface and a plurality of sidewalls positioned about a perimeter of the die connecting the active and the non-active surfaces, the plurality of sidewalls intersect with the non-active surface to form non-active side edges;
   placing the active surface of the die on a substrate;
   dispensing a first material at least between the active surface of the die and the substrate, the first material having adhesive properties including a first resin and a non-conductive first filler;
   dispensing a second material on at least a portion of the non-active surface of the die and on at least a portion of the first material to cover the non-active side edges of the die, the second material is in contact with the first material and leaves at least a portion of the non-active surface exposed to a surrounding environment of the die, the second material having thixotropic properties including a second resin and a non-conductive second filler; and
   simultaneously curing the first material and the second material.

2. The method of claim 1, wherein placing the active surface of the die on the substrate comprises placing the active surface of the die on a flexible circuit assembly located in an enclosure of an electronic device.

3. The method of claim 2, wherein the electronic device comprises a data storage system.

4. The method of claim 1, wherein providing a die comprises providing a semiconductor die made of silicon.

5. The method of claim 4, wherein providing the semiconductor die comprises providing a preamplifier integrated circuit.

6. The method of claim 1, further comprising depositing a plurality of conductive bumps on the active surface of the die prior to placing the active surface of the die on the substrate.

7. The method of claim 6, further comprising heating the conductive bumps after placing the active surface of the die on the substrate such that the bumps make an electrical connection with a corresponding plurality of electrical leads on the substrate.

8. A microelectronic device comprising:
   a die having an active surface an opposing a non-active surface substatially parallel with the active surface and a plurality of sidewalls positioned about a perimeter of the die connecting the active and non-active surfaces and forming non-active side edges where the sidewalls meet with the non-active surface, the active surface of the die configured to be placed on a substrate;
   an underfill material deposited at least between the active surface of the die and the substrate, the underfill material having adhesive properties including a first resin and a non-conductive first filler;
   a second material deposited on at least a portion of the non-active surface of the die to cover the non-active side edges of the die and leave at least a portion of the non-active surface exposed to a surrounding environment of the die, the second material in contact with the non-conductive underfill material and having thixotropic properties including a second resin and a non-conductive second filler; and wherein the underfill material and the second material are simultaneously cured.

9. The microelectronic device of claim 8, wherein the die comprises a plurality of sidewalls positioned about a perimeter of the die and between the active and the non-active surfaces, wherein the sidewalls form non-active side edges with the non-active surface.

10. The microelectronic device of claim 8, wherein the substrate comprises a flexible circuit assembly.

11. The microelectronic device of claim 8, wherein the substrate is included in an enclosure of an electronic device.

12. The microelectronic device of claim 11, wherein the electronic device comprises a data storage system.

13. The microelectronic device of claim 8, wherein the die comprises a preamplifier integrated circuit.

14. A microelectronic device comprising:
a semiconductor die including:
   a non-active surface;
   an opposing active surface substantually parallel with the non-active surface and configured to be placed on a substrate;
   a plurality of sidewalls positioned about a perimeter of the die and connecting the active and non-active surfaces, the plurality of sidewalls intersect with the non-active surface and the active surface to form side edges of the die;
a first material having adhesive properties including a first resin and a first filler, the first material dispensed between the active surface of the semiconductor die and the substrate;

a second material having thixotropic properties including a second resin and a second filler, the second material dispensed to coat all side edges of the semiconductor die and at least a portion of the non-active surface such that none of the edges of the die are left exposed to the surrounding environment of the die and at least a portion of the non-active surface is left exposed to the surrounding environment; and wherein the first material and the second material are in contact and are simultaneously cured.

15. The microelectronic device of claim 14, wherein the substrate comprises a flexible circuit assembly.

16. The microelectronic device of claim 15, wherein the flexible circuit assembly is located in an enclosure of an electronic device.

17. The microelectronic device of claim 16, wherein the electronic device comprises a data storage system.

18. An apparatus comprising:
a die having a non-active surface and an opposing active surface that is configured to be placed in electrical communication with a substrate;
an electrically non-conductive underfill material also operably extending outwardly from a sidewall of the die and covering an active edge of the die;
a second material operably supported by the underfill material and not contactingly engaging the substrate, the second material operably covering a non-active side edge of the die but leaving at least a portion of the non-active surface exposed to a surrounding environment of the die and leaving a least a portion of the underfill material exposed to the surrounding environment of the die.

* * * * *